(12) United States Patent
Machida et al.

(10) Patent No.: US 11,251,473 B2
(45) Date of Patent: Feb. 15, 2022

(54) SECONDARY BATTERY SYSTEM AND CONTROL METHOD FOR SECONDARY BATTERY

(71) Applicants: TOYOTA JIDOSHA KABUSHIKI KAISHA, Toyota (JP); DENSO CORPORATION, Kariya (JP)

(72) Inventors: Kiyohito Machida, Aichi-ken (JP); Hiroki Tashiro, Aichi-ken (JP); Yoshihiro Uchida, Nagakute (JP); Nobuyuki Tanaka, Toyota (JP); Masaki Uchiyama, Kariya (JP)

(73) Assignees: TOYOTA JIDOSHA KABUSHIKI KAISHA, Toyota (JP); DENSO CORPORATION, Kariya (JP)

( * ) Notice: Subject to any disclaimer, the term of this patent is extended or adjusted under 35 U.S.C. 154(b) by 0 days.

(21) Appl. No.: 16/768,376

(22) PCT Filed: Nov. 30, 2018

(86) PCT No.: PCT/IB2018/001367
§ 371 (c)(1),
(2) Date: May 29, 2020

(87) PCT Pub. No.: WO2019/111045
PCT Pub. Date: Jun. 13, 2019

(65) Prior Publication Data
US 2020/0303787 A1    Sep. 24, 2020

(30) Foreign Application Priority Data

Dec. 4, 2017   (JP) .............................. JP2017-232515

(51) Int. Cl.
*H01M 10/44* (2006.01)
*G01R 31/389* (2019.01)
(Continued)

(52) U.S. Cl.
CPC ............ *H01M 10/441* (2013.01); *B60L 58/12* (2019.02); *B60L 58/21* (2019.02); *G01R 31/389* (2019.01);
(Continued)

(58) Field of Classification Search
CPC ............. H01M 10/441; H01M 10/425; H01M 10/482; G01R 31/389; B60L 58/12;
(Continued)

(56) References Cited

U.S. PATENT DOCUMENTS 6,486,637 B1 * 11/2002 Nakanishi ............... B60L 58/22
                                                            320/150
10,162,014 B2 * 12/2018 Iida ...................... G01R 31/392
(Continued)

FOREIGN PATENT DOCUMENTS

JP    2008-182779 A       8/2008
JP    2008256673 A  * 10/2008  ......... G01R 31/3658
(Continued)

OTHER PUBLICATIONS

1. Measuring the internal resistance of a cell in assembled batteries, Ichimura et al., (Ichimura) (Proceedings of Intelec'96—International Telecommunications Energy Conference) Date of Conference: Oct. 6-10, 1996, pp. 784-791.*

*Primary Examiner* — M Baye Diao
(74) *Attorney, Agent, or Firm* — Sughrue Mion, PLLC (57) ABSTRACT

A secondary battery system includes an assembled battery that includes a plurality of blocks that are connected in series to one another. Each of the plurality of blocks includes same number of cells that are connected in parallel to one another. A control device is configured to calculate an internal resistance ratio and a protection current. The internal resistance ratio is a value obtained by dividing the higher one of internal resistances by the lower one of the internal (Continued)

resistances of two of the plurality of the blocks. The protection current is a value obtained by multiplying the internal resistance ratio by a current value of the assembled battery detected by a current sensor. The control device is configured to perform the charge-discharge control based on the protection current.

7 Claims, 9 Drawing Sheets

(51) Int. Cl.
    *B60L 58/12*     (2019.01)
    *B60L 58/21*     (2019.01)
    *H01M 10/42*     (2006.01)
    *H01M 10/48*     (2006.01)

(52) U.S. Cl.
    CPC ....... *H01M 10/425* (2013.01); *H01M 10/482* (2013.01); *B60L 2240/547* (2013.01); *B60L 2240/549* (2013.01)

(58) Field of Classification Search
    CPC ............... B60L 58/21; B60L 2240/547; B60L 2240/549; B60L 2240/545; B60L 3/0046; B60L 58/16; Y02E 60/10; Y02T 10/70; H02J 7/0013; H02J 7/0047; H02J 7/00304
    USPC ......................................................... 320/116
    See application file for complete search history.

(56) References Cited

U.S. PATENT DOCUMENTS

| | | | |
|---|---|---|---|
| 10,266,063 B2 * | 4/2019 | Ohkawa | G01R 31/387 |
| 10,879,570 B2 * | 12/2020 | Yamauchi | H02J 7/00 |
| 2009/0112496 A1 | 4/2009 | Suzuki | |
| 2011/0127958 A1 | 6/2011 | Ishishita et al. | |
| 2011/0156618 A1 * | 6/2011 | Seo | H01M 10/425 |
| | | | 318/3 |

FOREIGN PATENT DOCUMENTS

| | | |
|---|---|---|
| JP | 2017-211262 A | 11/2017 |
| WO | 2010/005079 A1 | 1/2010 |

* cited by examiner

SECONDARY BATTERY SYSTEM AND CONTROL METHOD FOR SECONDARY BATTERY

CROSS REFERENCE TO RELATED APPLICATIONS

This application is a National Stage of International Application No. PCT/IB2018/001367 filed Nov. 30, 2018, claiming priority based on Japanese Patent Application No. 2017-232515 filed Dec. 4, 2017, the contents of all of which are incorporated herein by reference in their entirety.

BACKGROUND OF THE INVENTION

1. Field of the Invention

The present disclosure relates to a secondary battery system and a control method for the same. More specifically, the present disclosure relates to an art of controlling the charge/discharge of an assembled battery in accordance with a current value of the assembled battery.

2. Description of Related Art

In recent years, electrically operated vehicles such as hybrid vehicles, electric vehicles and the like have been becoming popular. Each of these electrically operated vehicles is mounted with an assembled battery. An in-vehicle assembled battery having the following configuration can be adopted. That is, the assembled battery includes a plurality of blocks that are connected in series to one another. In addition, each of the plurality of blocks includes the same number of cells that are connected in parallel to one another.

There is proposed an art that uses an internal resistance of the assembled battery having this configuration for charge-discharge control of the assembled battery. For example, according to Japanese Patent Application Publication No. 2008-182779 (JP 2008-182779 A), the charge/discharge of an assembled battery is stopped when it is determined based on an internal resistance of each of blocks that there is a cell in which a current interruption mechanism has operated.

In the assembled battery having the foregoing configuration, the respective cells are required to be protected by performing charge-discharge control for preventing an excessively large current from flowing through each of the cells or preventing the temperature of each of the cells from becoming excessively high. In general, when the internal resistance of a certain cell increases in a block including a plurality of cells that are connected in parallel to one another, the current becomes unlikely to flow through that cell, and the current flowing through each of the other cells increases correspondingly. That is, the distribution of current among the plurality of the cells that are connected in parallel to one another can be biased. There is room for improvement from the standpoint of protecting the cells, since this bias in current distribution is not considered in particular in Japanese Patent Application Publication No. 2008-182779 (JP 2008-182779 A).

SUMMARY OF THE INVENTION

The present disclosure provides an art capable of appropriately protecting respective cells that are included in an assembled battery.

A secondary battery system according to an aspect of the present disclosure is equipped with an assembled battery, a current sensor that detects a current that is input to and output from the assembled battery, and a control device that performs charge-discharge control of the assembled battery in accordance with a current value of the assembled battery. The assembled battery includes a plurality of blocks that are connected in series to one another. Each of the plurality of the blocks includes cells that are connected in parallel to one another. Each of the plurality of the blocks includes the same number of cells. The control device is configured to calculate a first internal resistance indicating an internal resistance of the first block as one of the plurality of the blocks and a second internal resistance indicating an internal resistance of the second block as another one of the plurality of the blocks. The control device is configured to calculate an internal resistance ratio obtained by dividing the higher one of the first internal resistance and the second internal resistance by the lower one of the first internal resistance and the second internal resistance. The control device performs charge-discharge control based on a value obtained by multiplying the internal resistance ratio by a current value detected by the current sensor.

According to the aforementioned configuration, the value obtained by multiplying the internal resistance ratio by the current value detected by the current sensor is used for charge-discharge control of the assembled battery. The internal resistance ratio is equal to or larger than 1, so the current value used for charge-discharge control of the assembled battery is larger than a detection value of the current sensor (i.e., an actual current value). Then, protection control (high-rate deterioration suppression control or lithium deposition suppression control, which will be described later, or the like) of the assembled battery is performed earlier than in the case where the charge-discharge of the assembled battery is controlled in accordance with the actual current value. Accordingly, the respective cells that are included in the assembled battery can be appropriately protected.

According to the present disclosure, the respective cells that are included in the assembled battery can be appropriately protected.

In a control method for a secondary battery according to another aspect of the present disclosure, the secondary battery is equipped with an assembled battery, a current sensor, and a control device. The assembled battery includes a plurality of blocks that are connected in series to one another. Each of the plurality of the blocks includes cells that are connected in parallel to one another. Each of the plurality of the blocks includes the same number of cells. The current sensor is configured to detect a current that is input to and output from the assembled battery. The control method includes calculating a first internal resistance and a second internal resistance, calculating an internal resistance ratio, calculating a protection current, and performing charge-discharge control based on the protection current by the control device. The first internal resistance is an internal resistance of the first block as one of the plurality of the blocks. The second internal resistance is an internal resistance of the second block as another one of the plurality of the blocks. The internal resistance ratio is a value obtained by dividing the higher one of the first internal resistance and the second internal resistance by the lower one of the first internal resistance and the second internal resistance. The protection current is a value obtained by multiplying the internal resistance ratio by a current value detected by the current sensor.

According to the present disclosure, the respective cells that are included in the assembled battery can be appropriately protected.

BRIEF DESCRIPTION OF THE DRAWINGS

Features, advantages, and technical and industrial significance of an exemplary embodiment of the invention will be described below with reference to the accompanying drawings, in which like numerals denote like elements, and wherein.

DETAILED DESCRIPTION OF EMBODIMENT

The embodiment of the present disclosure will be described hereinafter in detail with reference to the drawings. Incidentally, like or equivalent components in the drawings are denoted by like reference symbols, and the description thereof will not be repeated.

A configuration in which a secondary battery system according to the present embodiment is mounted in an electrically operated vehicle will be described hereinafter as an example. However, the secondary battery system may not necessarily be used in a vehicle, but may be, for example, stationary.

Configuration of Secondary Battery System

Figure 1:
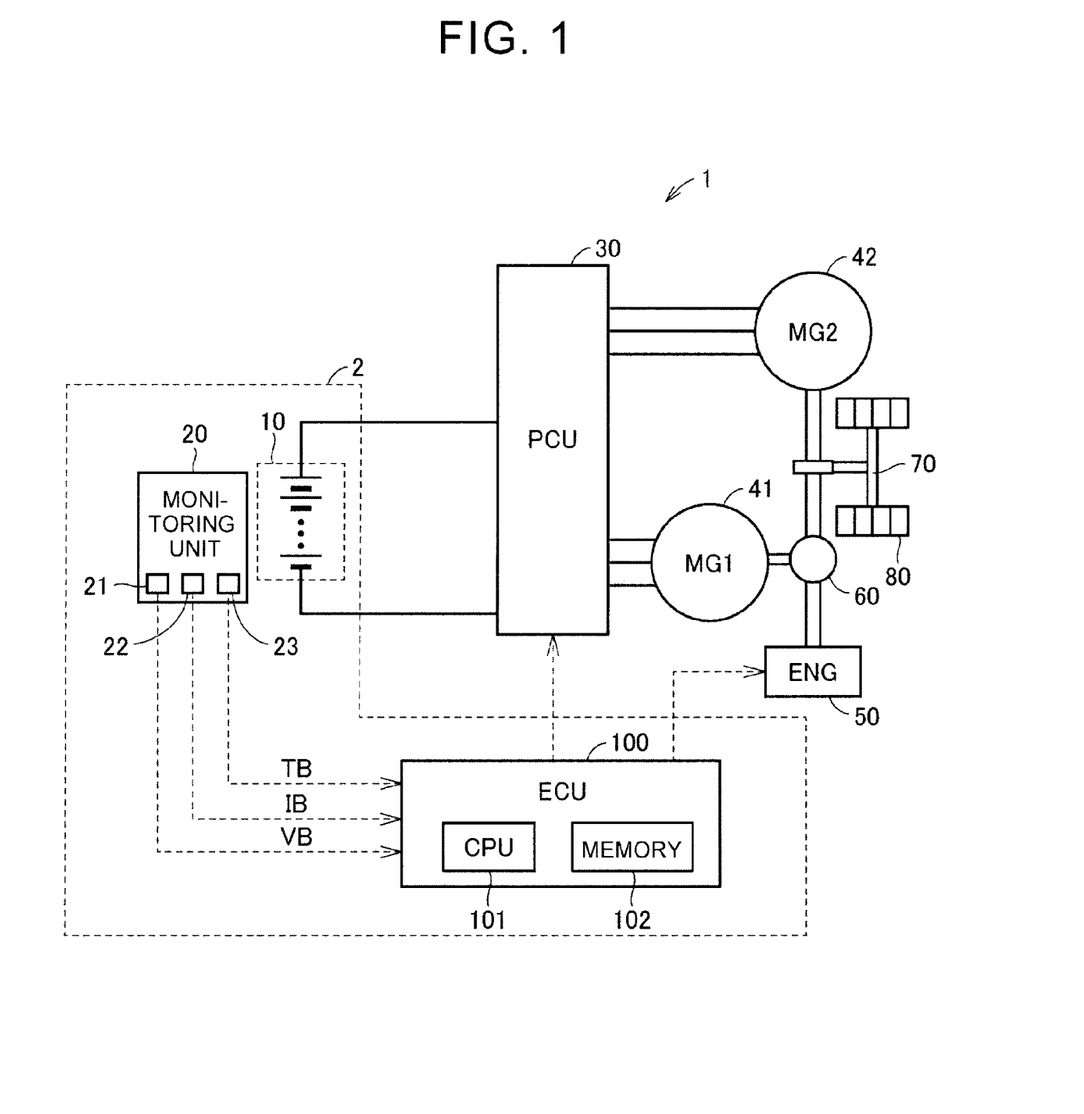
FIG. 1 is a view schematically showing the general configuration of a vehicle that is mounted with a secondary battery system according to the present embodiment.

FIG. 1 is a view schematically showing the general configuration of a vehicle that is mounted with a secondary battery system according to the present embodiment. Referring to FIG. 1, a vehicle 1 is a hybrid vehicle. However, a vehicle that can be mounted with the secondary battery system according to the present disclosure may not necessarily be a hybrid vehicle (including a plug-in hybrid vehicle). The secondary battery system according to the present disclosure can be mounted in any vehicle that generates a driving force through the use of an electric power that is supplied from the secondary battery system. Therefore, the vehicle 1 may be an electric vehicle or a fuel cell-powered vehicle.

The vehicle 1 is equipped with a secondary battery system 2, a power control unit (a PCU) 30, motor-generators 41 and 42, an engine 50, a power split device 60, a drive shaft 70, and driving wheels 80. The secondary battery system 2 is equipped with an assembled battery 10, a monitoring unit 20, and an electronic control unit (an ECU) 100.

The engine 50 is an internal combustion engine that outputs a motive power by converting combustion energy produced at the time of combustion of a mixture of air and fuel into kinetic energy of moving elements such as a piston, a rotor and the like.

The power split device 60 includes, for example, a planetary gear mechanism (not shown) having three rotary shafts, such as a sun gear, a carrier, and a ring gear. The power split device 60 divides the motive power output from the engine 50 into a motive power that drives the motor-generator 41 and a motive power that drives the driving wheels 80.

Each of the motor-generators 41 and 42 is an AC rotating electrical machine, for example, a three-phase AC synchronous electric motor having a rotor in which a permanent magnet (not shown) is embedded. The motor-generator 41 is mainly used as a generator that is driven by the engine 50 via the power split device 60. An electric power generated by the motor-generator 41 is supplied to the motor-generator 42 or the assembled battery 10 via the PCU 30.

The motor-generator 42 mainly operates as an electric motor, and drives the driving wheels 80. The motor-generator 42 is driven upon receiving at least one of an electric power from the assembled battery 10 or an electric power generated by the motor-generator 41', and a driving force of the motor-generator 42 is transmitted to the drive shaft 70. On the other hand, when the vehicle is braked or decelerated on a downhill, the motor-generator 42 operates as a generator to carry out regenerative electric power generation. An electric power generated by the motor-generator 42 is supplied to the assembled battery 10 via the PCU 30.

The assembled battery 10 stores an electric power for driving the motor-generators 41 and 42, and supplies the electric power to the motor-generators 41 and 42 through the PCU 30. Besides, when the motor-generators 41 and 42 generate an electric power, the assembled battery 10 is charged upon receiving the generated electric power through the PCU 30. The assembled battery 10 includes a plurality of blocks. Each of the blocks includes a plurality of cells. Each of the cells is a secondary battery, for example, a lithium-ion secondary battery, a nickel hydride battery or the like.

The monitoring unit 20 includes a voltage sensor 21 (voltage sensors 211 to 21M shown in FIG. 2), a current sensor 22, and a temperature sensor 23. The voltage sensor 21 detects a voltage VB of the assembled battery 10. The current sensor 22 detects a current IB that is input to and output from the assembled battery 10. The temperature sensor 23 detects a temperature TB of the assembled battery 10. Each of the sensors outputs a signal indicating a detection result thereof to the ECU 100. The configurations of the assembled battery 10 and the monitoring unit 20 will be described in more detail with reference to FIG. 2.

The PCU 30 carries out bilateral electric power conversion between the assembled battery 10 and the motor-generators 41 and 42 in accordance with a control signal from the ECU 100. The PCU 30 is configured to be able to separately control states of the motor-generators 41 and 42. For example, the PCU 30 can render the motor-generator 42 in a power running state while rendering the motor-generator 41 in a regenerative state (an electric power generation state). The PCU 30 is configured to include, for example, two inverters (not shown) that are provided in such a manner as to correspond to the motor-generators 41 and 42 respectively, and a converter (not shown) that steps up a DC voltage supplied to each of the inverters to a voltage equal to or higher than an output voltage of the assembled battery 10.

The ECU 100 is configured to include a central processing unit (a CPU) 101, a memory (a read only memory (a ROM) and a random access memory (a RAM)) 102, and input/output ports (not shown) to/from which various signals are input/output. The ECU 100 performs various processes for controlling the vehicle 1 to a desired state based on signals received from the respective sensors, a program stored in the memory 102, and a map stored in the memory 102. In concrete terms, the ECU 100 controls the charge/discharge of the assembled battery 10 by controlling the engine 50 and the PCU 30. As will be described later in detail, a current value of the assembled battery 10 is used for charge-discharge control of the assembled battery 10 (more specifically, "protection control" of the assembled battery). Besides, the ECU 100 calculates internal resistances of the respective blocks in the assembled battery 10. The calculation of the internal resistances will also be described later in detail.

Figure 2:
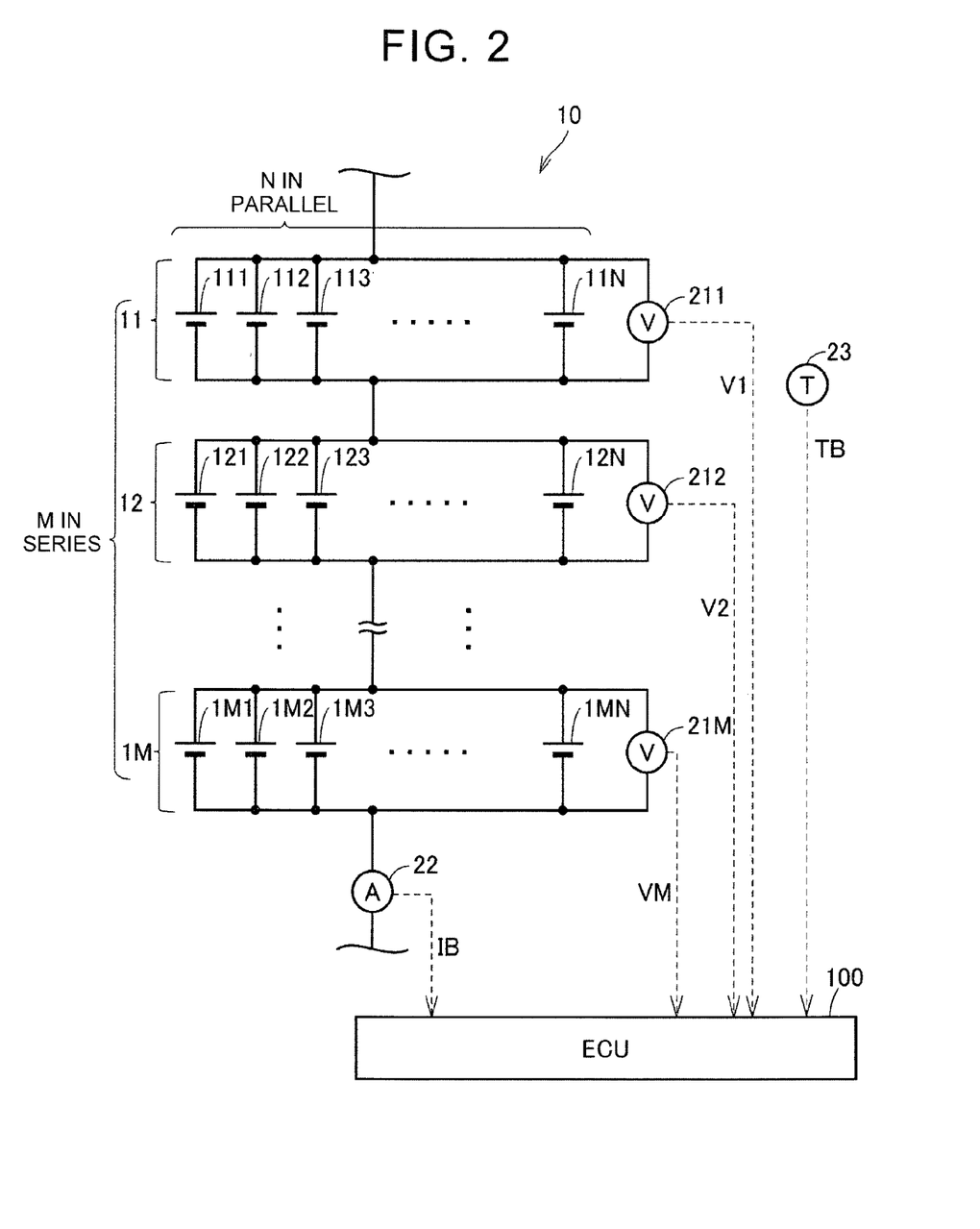
FIG. 2 is a view showing the configurations of an assembled battery and a monitoring unit in more detail.

FIG. 2 is a view showing the configurations of the assembled battery 10 and the monitoring unit 20 in more detail. Referring to FIG. 2, the assembled battery 10 includes M blocks 11 to 1M that are connected in series to one another. The block 11 and the block 12 are provided adjacently to each other. The block 12 and the block 13 are provided adjacently to each other. The same holds true for the other blocks 14 to 1M. Each of the blocks 11 to 1M includes N (the same number of) cells that are connected in parallel to one another. Each of M and N is a natural number equal to or larger than 2.

The voltage sensor 211 detects a voltage V1 of the block 11. The voltage sensor 212 detects a voltage V2 of the block 12. The same holds true for the other voltage sensors 213 to 21M. The current sensor 22 detects the current IB that is input to and output from the assembled battery 10. The temperature sensor 23 detects a temperature of the assembled battery 10. Each of the sensors outputs a detection result thereof to the ECU 100. Incidentally, the temperature sensor may be provided, for example, for each of several blocks, instead of providing the single temperature sensor for the entire assembled battery 10.

Bias in Current Distribution

In the secondary battery system 2 configured as described above, the internal resistance of the assembled battery 10 increases as the assembled battery 10 become deteriorated. The increase in internal resistance is ascribable to, for example, a decrease in effective electrode area resulting from detachment of an electrode, detachment of a welded section of a current collector, the slipping down of an electrode active material and the like in any one of the cells in the assembled battery 10. As will be described below, the distribution of the current flowing in the assembled battery 10 (the blocks) changes before and after the increase in internal resistance of the assembled battery 10.

Figure 3:
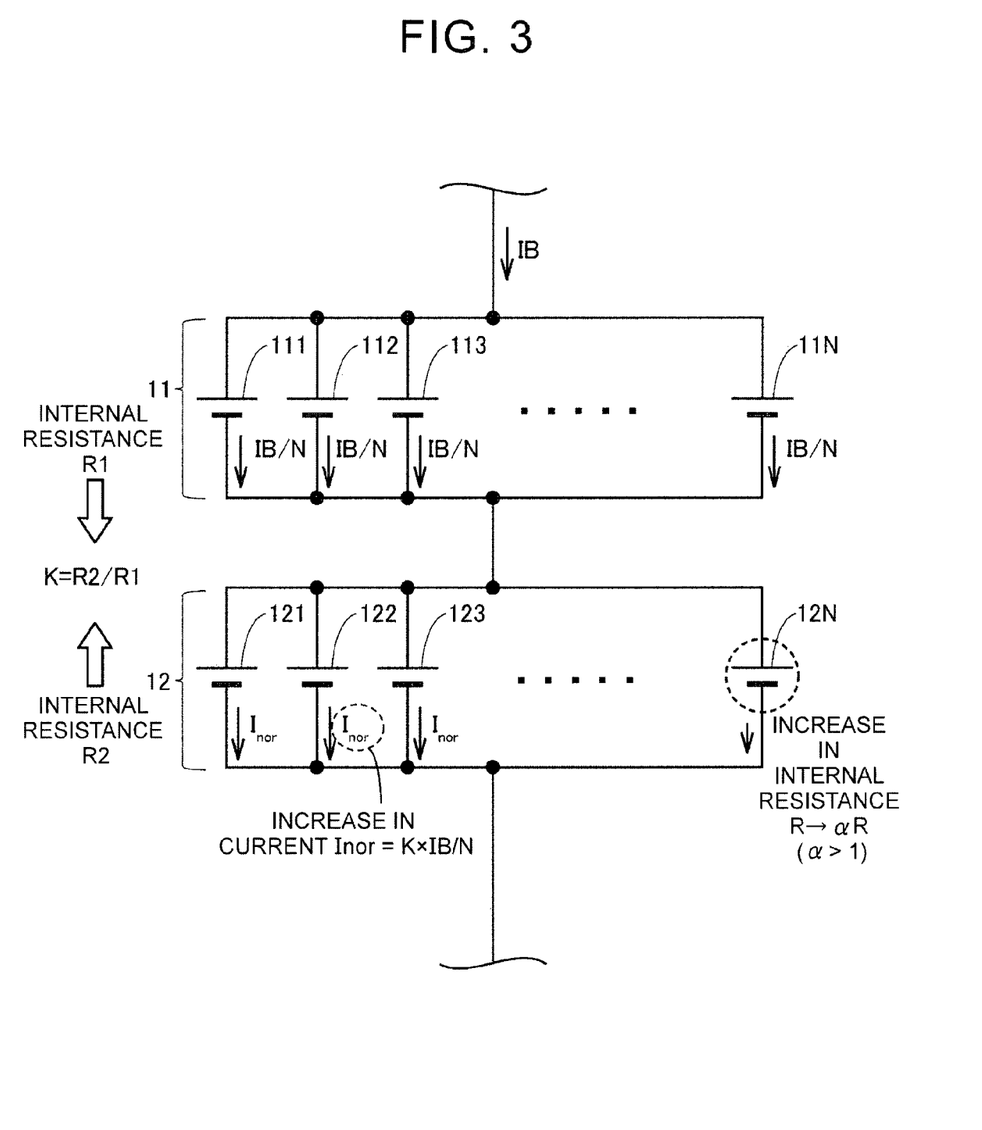
FIG. 3 is a view for making a comparison between a state before an increase in internal resistance of the assembled battery and a state after the increase in internal resistance of the assembled battery.

FIG. 3 is a view for making a comparison between a state before the increase in internal resistance of the assembled battery 10 and a state after the increase in internal resistance of the assembled battery 10. In order to facilitate understanding, the following description will be given using the two blocks 11 and 12.

Referring to FIG. 3, the block 11 includes cells 111 to 11N. The block 12 includes cells 121 to 12N. In this case, there is assumed a situation where the internal resistance of the cell 12N as one of the cells 121 to 12N included in the block 12 has increased although all the cells 111 to 11N included in the block 11 are normal (i.e., although the internal resistance thereof has not increased).

The internal resistance of the normal cells is denoted by R. Then, an internal resistance R1 of the block 11 is expressed by an equation (1) shown below.

$$R1 = R/N \qquad (1)$$

On the other hand, it is assumed that the internal resistance of the cell 12N has increased to $\alpha R$ by being multiplied by K in the block 12 ($\alpha > 1$). The internal resistance of the other cells 121 to 12(N−1) remains equal to R. In this case, the internal resistance R2 of the block 12 is calculated according to an equation (2) shown below.

$$1/R2 = (N-1) \times 1/R + 1/\alpha R \qquad (2)$$

When the equation (2) is transformed, the internal resistance R2 of the block 12 is expressed by an equation (3) shown below.

$$R2 = \alpha R / \{\alpha(N-1)+1\} \qquad (3)$$

A ratio of the internal resistance R2 of the block 12 to the internal resistance R1 of the block 11 can be expressed by an equation (4) shown below, from the equations (1) and (3). This ratio will be referred to hereinafter as "an internal resistance ratio K". The internal resistance ratio K is larger than 1 (K>1).

$$K = R2/R1 = \alpha N / \{\alpha(N-1)+1\} \qquad (4)$$

Subsequently, it will be described how a current Inor flowing through each of the cells is expressed as to each of the cells included in the block 12 other than the cell 12N, namely, each of the (N−1) normal cells 121 to 12(N−1). First of all, a synthetic cell obtained by virtually synthesizing the normal cells 121 to 12(N−1) is considered, and a current flowing through this synthetic cell is denoted by IX. A synthetic internal resistance of this synthetic cell is denoted by R(N−1). On the other hand, a current flowing through the cell 12N whose internal resistance has increased to aR is denoted by IY. When the internal resistance of the cell 12N increases, the current becomes unlikely to flow through the cell 12N (the current IY decreases in accordance with $\alpha$), whereas the current IX flowing through the synthetic cell increases correspondingly. A ratio between the current IX and the current W is equal to a reciprocal ratio of the internal resistance, and is expressed by an equation (5) shown below.

$$IX:IY = \alpha R : \{R/(N-1)\} \qquad (5)$$

When this equation (5) and a relational expression (IX+IY=IB) indicating the law of current preservation (the first law of Kirchhoff) are simultaneously solved as to the current IX, an equation (6) shown below is obtained.

$$IX = \alpha(N-1)/\{\alpha(N-1)+1\} \times IB \qquad (6)$$

The current Inor flowing through each of the normal cells 121 to 12(N−1) is obtained by dividing IX by (N−1), and hence is expressed by an equation (7) shown below.

$$Inor = \alpha / \{\alpha(N-1)+1\} \times IB \qquad (7)$$

It is apparent from the equations (4) and (7) that the current Inor flowing through each of the normal cells 121 to 12(N−1) is expressed through the use of the internal resistance ratio K, as indicated by an equation (8) shown below. The equation (8) indicates that the current Inor increases in proportion to the internal resistance ratio K.

$$Inor = K \times IB/N \qquad (8)$$

As described hitherto, when the internal resistance of the cell 12N increases to αR, the current Inor flowing through each of the other normal cells 121 to 12(N−1) that are connected in parallel to one another in the block increases, and the distribution of current is biased. When this bias in current distribution is not taken into account, the excessively large current Inor flows through the normal cells 121 to 12(N−1) as the internal resistance ratio K increases, so that it may be impossible to appropriately protect the cells 121 to 12(N−1).

Thus, in the present embodiment, a configuration for controlling the charge/discharge of the assembled battery 10 is adopted on the assumption that a current (K×IB) obtained by multiplying the current IB by the internal resistance ratio K flows through each of the blocks 11 to 1M, in view of a calculation result of the aforementioned equation (8). Thus, the assumption of the flow of the current (K×IB) larger than the actual current (IB) through each of the blocks 11 to 1M is equivalent to the setting of a margin for the current flowing through each of the blocks 11 to 1M. By setting the current margin, various kinds of control (which will be described later) for suppressing the charge/discharge of the assembled battery 10 are performed before the current flowing through each of the cells excessively increases, so the respective cells can be appropriately protected. The current (K×B) obtained by multiplying the current IB by the internal resistance ratio K will be referred to hereinafter as "a protection current IBp", and a method of calculating the protection current will be described.

Flow of Calculation of Protection Current

Figure 4:
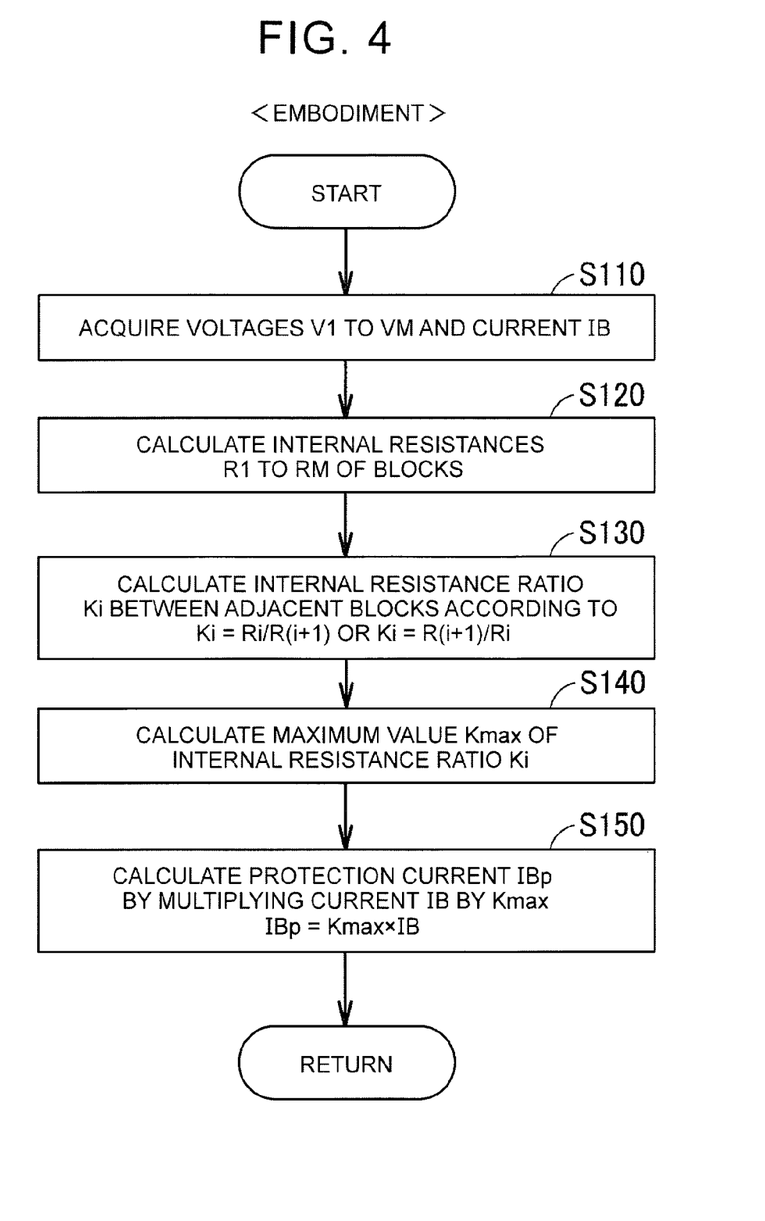
FIG. 4 is a flowchart showing a method of calculating a protection current of the assembled battery in the present embodiment.

FIG. 4 is a flowchart showing a method of calculating the protection current IBp of the assembled battery 10 in the present embodiment. The flowchart shown in FIG. 4 and flowcharts shown in FIGS. 6 and 7, which will be described later, are invoked from a main routine (not shown) and executed, for example, every time a predetermined cycle elapses. Each step (which will be abbreviated as S) is basically realized through a software process by the ECU 100, but may be realized through a hardware process by an electronic circuit prepared in the ECU 100.

Referring to FIG. 4, in S110, the ECU 100 acquires the voltages V1 to VM of the blocks 11 to 1M, and acquires the current IB flowing through the assembled battery 10, from the respective sensors in the monitoring unit 20.

In S120, the ECU 100 calculates the internal resistances R1 to RM of the blocks 11 to 1M. The internal resistance R1 of the block 11 can be calculated, for example, as follows.

Figure 5:
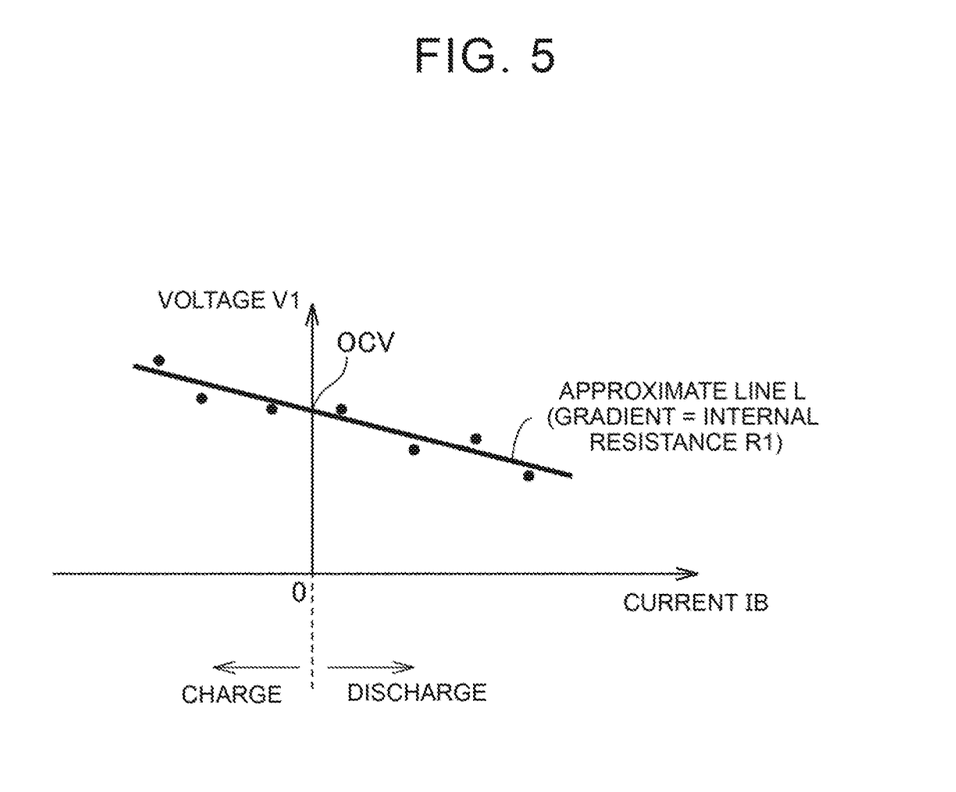
FIG. 5 is a view for illustrating an exemplary method of calculating an internal resistance of each block.

FIG. 5 is a view for illustrating an exemplary method of calculating the internal resistance R1 of the block 11. In FIG. 5, the axis of abscissa represents the current IB, and the axis of ordinate represents the voltage V1 (a detection value of the voltage sensor 211).

The ECU 100 repeatedly acquires the voltage V1 and the current IB during a predetermined period in the processing step of Si, and plots the acquired values on a graph as shown in FIG. 5. Then, the ECU 100 calculates an approximate line L indicating a relationship between the voltage V1 and the current IB, according to a least-square method. Then, the gradient of the approximate line L indicates the internal resistance R1 of the block 11. Although the description will not be repeated, the internal resistances R2 to RM can be calculated by subjecting the other blocks 12 to 1M to the same procedure.

Incidentally, from the standpoint of enhancing the accuracy in calculating the gradient of the approximate line L (=the internal resistance), it is preferable to set the foregoing predetermined period long to some extent, and plot the detection values of the voltage sensor 21 and the current sensor 22 on the graph over a relatively extensive range. In more concrete terms, it is preferable to set a long period such as one second or the like as the predetermined period (incidentally, the sampling cycle can be set to about 100 milliseconds), and use a result obtained in a situation where the width of variation in the current IB is large, such as a situation where the sign of the current IB changes during the period, or the like.

Returning to FIG. 4, the ECU 100 calculates an internal resistance ratio Ki (i=1 to (N−1)) between the two adjacent blocks in S130. The internal resistances of the two adjacent blocks are Ri and R(i+1). The larger value of two ratios Ri/R(i+1) and R(i+1)/Ri, which are different in order from each other, can be adopted as the internal resistance ratio Ki. Alternatively, Ki may be calculated as Ri/R(i+1) when Ri/R(i+1) is equal to or larger than 1, and Ki may be calculated as R(i+1)/Ri when Ri/R(i+1) is smaller than 1. As a consequence, a value obtained by dividing the higher one of two internal resistances by the lower one of the two internal resistances is adopted as the internal resistance ratio Ki.

In S140, the ECU 100 obtains a maximum value Kmax of all the internal resistance ratios Ki. Then, the ECU 100 calculates a value obtained by multiplying the current IB detected by the current sensor 22 by the maximum value Kmax of the internal resistance ratios Ki, as the protection current IBp (IBp=Kmax×IB) (S150).

The protection current IBp can be calculated according to the processing flow as described above. Then, charge-discharge control of the assembled battery 10 is performed through the use of the protection current IBp. As an example of this charge-discharge control, an example of protection control for protecting the assembled battery 10 by suppressing the charge/discharge of the assembled battery 10 (high-rate suppression control and lithium deposition suppression control) will be briefly described later.

Methods other than the one described with reference to FIGS. 4 and 5 are also conceivable as the method of calculating the protection current IBp. For example, methods as indicated by the following modification examples 1 and 2 can also be adopted.

Figure 6:
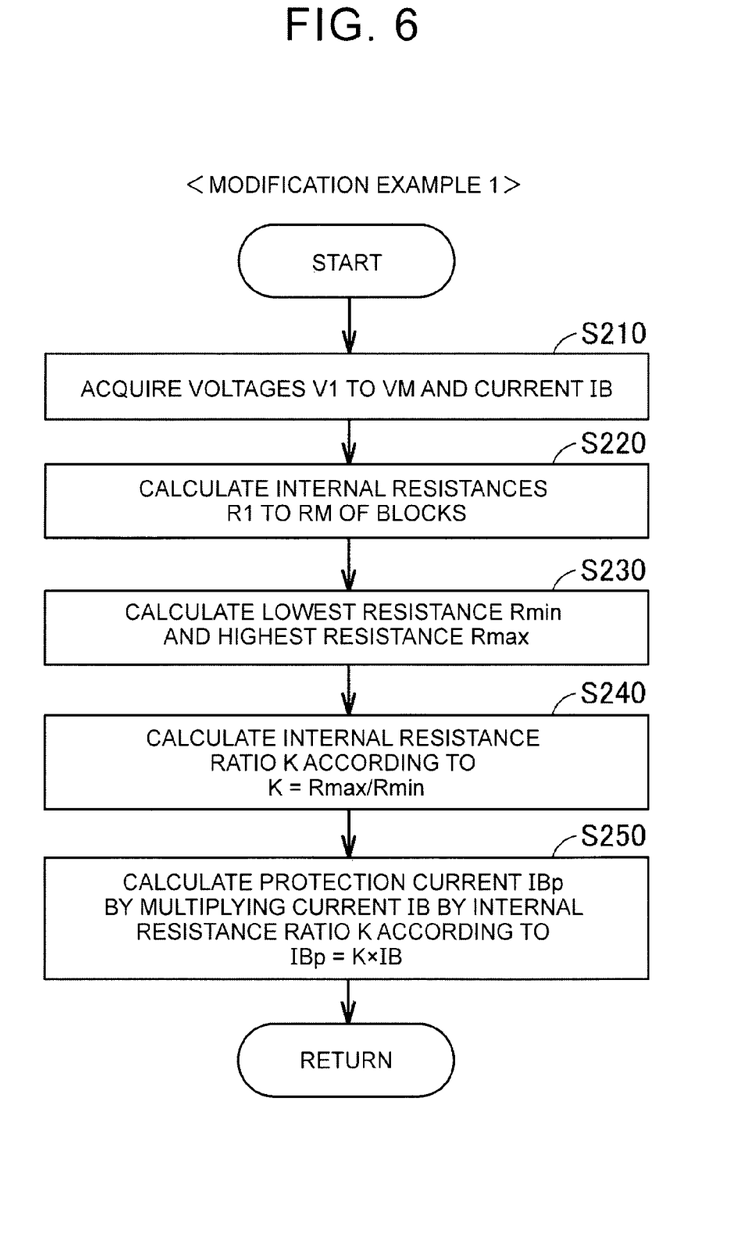
FIG. 6 is a flowchart showing a method of calculating the protection current of the assembled battery in a modification example 1 of the present embodiment.

FIG. 6 is a flowchart showing a method of calculating the protection current IBp of the assembled battery 10 in the modification example 1 of the present embodiment. Referring to FIG. 6, the processing steps of S210 and 5220 are equivalent to the processing steps of S110 and S120 (see FIG. 4) in the embodiment respectively. The same holds true for FIG. 7, which will be described later.

In S230, the ECU 100 obtains a lowest one of the internal resistances R1 to RM (a lowest resistance) Rmin, and obtains a highest one of the internal resistances R1 to RM (a highest resistance) Rmax.

In S240, the ECU 100 calculates the internal resistance ratio K (=Rmax/Rmin) of the highest resistance Rmax to the lowest resistance Rmin. Then, in S250, the ECU 100 calculates a value obtained by multiplying the current IB detected by the current sensor 22 by the internal resistance ratio K, as the protection current IBp (IBp=K×IB).

The protection current IBp can be calculated according to the foregoing processing flow, as is the case with the processing flow (see FIG. 4) described in the embodiment.

Incidentally, in calculating the internal resistance ratio K in S240, a value obtained by multiplying the lowest resistance Rmin by a safety margin M (it should be noted, however, that M<1) may be used instead of simply using the lowest resistance Rmin. In this case, an internal resistance ratio K' is expressed as K'=Rmax/(Rmin×M), and K'>K. That is, by being multiplied by the safety margin M, the internal resistance ratio K' becomes larger than in the case where the internal resistance ratio K' is not multiplied by the safety margin M. Thus, the protection current IBp becomes large, so the assembled battery 10 can be more reliably protected.

A fixed value may be used as the safety margin M. In general, however, the internal resistance has dependency on the temperature and dependency on the SOC. It is therefore more preferable to use the safety margin M that assumes a value corresponding to the temperature of the assembled battery 10 and the state of charge (the SOC) thereof.

Figure 7:
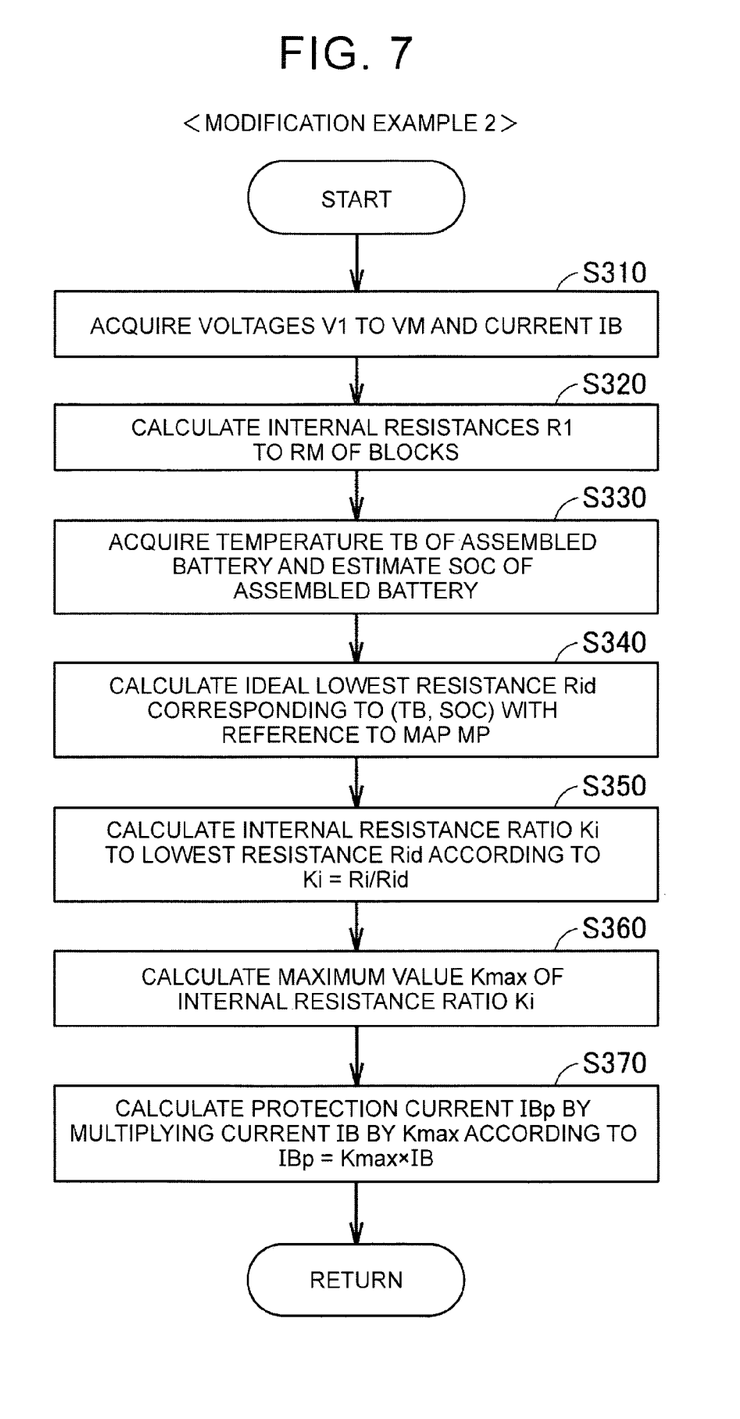
FIG. 7 is a flowchart showing a method of calculating the protection current of the assembled battery in a modification example 2 of the present embodiment.

FIG. 7 is a flowchart showing a method of calculating the protection current IBp of the assembled battery 10 in the modification example 2 of the present embodiment. In this modification example 2, an ideal (or virtual) block whose internal resistance is the lowest in a certain state of the assembled battery 10 (TB and SOC) is assumed, and an internal resistance of the block is calculated, instead of calculating the internal resistances R1 to RM (Ri) of the blocks 11 to 1M and calculating the lowest resistance Rmin therefrom.

In concrete terms, in S330, the ECU 100 acquires the temperature TB of the assembled battery 10 from the temperature sensor 23, and estimates the SOC of the assembled battery 10. Any one of known methods can be adopted as a method of estimating the SOC. For example, a method of estimating the SOC from an OCV of the assembled battery 10 with reference to an OCV-SOC curve stored in the memory 102 after measuring the OCV may be used. Alternatively, a method of integrating a current that is input to and output from the assembled battery 10 can also be used.

A map MP (not shown) showing a corresponding relationship among the internal resistance, temperature TB and SOC of each of the blocks is prepared through a preliminary test and stored in the memory 102 of the ECU 100. The ECU 100 obtains the internal resistance from the temperature TB and SOC of the assembled battery 10 by referring to the map MP (S340). More specifically, in this map MP, a lowest value that can be assumed by the internal resistance of each of the blocks is prescribed in accordance with a combination (TB and SOC) of the temperature TB and SOC of the assembled battery 10. This lowest value is an internal resistance value (a lowest resistance Rid) of each of the blocks that is constituted only of cells that are all assumed to have the lowest resistance as an ideal state. By referring to the map MP, the ideal lowest resistance Rid in the combination (TB, SOC) of the assembled battery 10 can be calculated.

In S350, the ECU 100 calculates a ratio of each of the internal resistances Ri to the lowest resistance Rid as the internal resistance ratio Ki (Ki=Ri/Rid). In S360, a maximum value Kmax of the internal resistance ratio Ki is obtained. Then, the ECU 100 calculates a value obtained by multiplying the current IB detected by the current sensor 22 by the maximum internal resistance ratio Kmax, as the protection current IBp (IBp=Kmax×IB) (S370).

The use of the processing flow of the modification example 2 as described above also makes it possible to calculate the protection current IBp, as is the case with the flows (see FIGS. 4 and 6) described in the embodiment and the modification example 1.

As described above, according to the embodiment and the modification examples 1 and 2 thereof, the protection current IBp obtained by multiplying the current value IB detected by the current sensor 22 by the internal resistance ratio K (Kmax or the like) is used as the current value of the assembled battery 10. The internal resistance ratio K is equal to or larger than 1, so the current value used for charge-discharge control of the assembled battery 10 is larger than the detection value of the current sensor 22 (the actual current IB). Then, in high-rate deterioration suppression control or lithium deposition suppression control, which will be described later, or the like, the control for protecting the assembled battery 10 (regenerative limitation or the like) is performed in the early stage. Accordingly, the respective cells that are included in the assembled battery 10 can be appropriately protected.

Incidentally, in FIGS. 4, 6 and 7, the example in which the internal resistance ratio K is calculated in accordance with the combination (Rmax/Rmin or the like) of the internal resistances between which the ratio is maximized has been described. As described hitherto, the assembled battery 10 can be more reliably protected by setting a maximum possible value as the internal resistance ratio K. However, the combination of the internal resistances for calculating the internal resistance ratio K is not limited to this combination. The ratio between the internal resistances of any two of the M blocks that are included in the assembled battery 10 may be used. It is not indispensable to adopt the combination of the internal resistances between which the ratio is maximized.

High-Rate Deterioration Suppression Control

When charge/discharge is continuously carried out with a relatively large current in the case where a lithium-ion secondary battery as an assembled battery is adopted as the assembled battery 10, "a high-rate deterioration" as a deterioration phenomenon with an increase in internal resistance of the assembled battery 10 can be caused. The high-rate deterioration is a deterioration that results from various factors including a bias in the distribution of concentration of lithium ions (the distribution of concentration of salt) inside electrode bodies. In the present embodiment, the ECU 100 can perform "high-rate deterioration suppression control" for suppressing the progress of the high-rate deterioration of the assembled battery 10. It is known that the progress of the high-rate deterioration is associated with, for example, the SOC.

Figure 8:
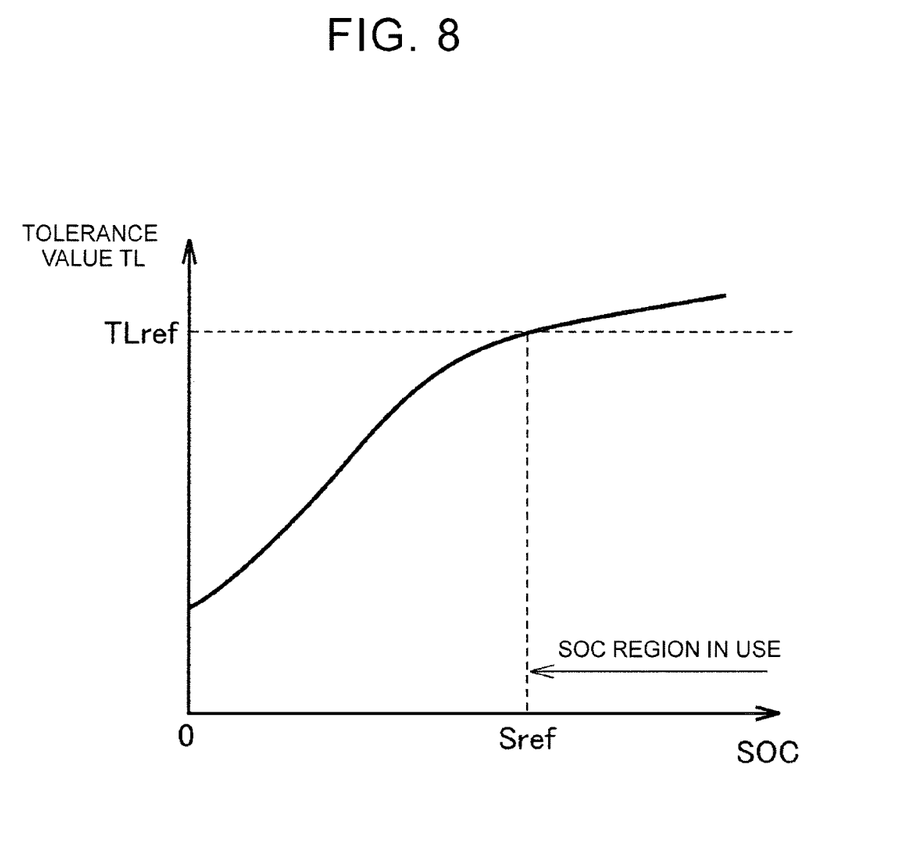
FIG. 8 is a conceptual view for illustrating a relationship between the progress of a high-rate deterioration and the SOC of the assembled battery.

FIG. 8 is a conceptual view for illustrating a relationship between the progress of the high-rate deterioration and the SOC of the assembled battery 10. In FIG. 8, the axis of abscissa represents the SOC of the assembled battery 10. The axis of ordinate represents "a tolerance value TL" as an index value indicating the unlikeliness of the high-rate deterioration progressing in the assembled battery 10. The high-rate deterioration is likely to progress when the tolerance value TL is low. The unlikeliness of the progress of the high-rate deterioration increases as the tolerance value TL rises.

As shown in FIG. 8, the tolerance value TL is high to some extent in a region where the SOC of the assembled battery 10 is relatively high. However, the tolerance value TL falls as the SOC falls. It is therefore desirable to hold the SOC of the assembled battery 10 within an SOC region where the tolerance value TL is relatively high. In more concrete terms, it is desirable to adjust the SOC of the assembled battery 10 to the SOC region where the tolerance value TL is higher than a reference value TLref (the SOC region equal to or higher than Sref).

This adjustment of the SOC can be realized as follows. That is, in the vehicle 1, the SOC of the assembled battery 10 is controlled within a certain SOC region including a center value determined in advance (an SOC control center), and the SOC control center can be made higher than usual. High-rate deterioration suppression control is usually not performed. Alternatively, upper and lower limits (especially the lower limit) of the SOC region in use may be made higher than usual. Thus, it is possible to realize a state where the tolerance value TL is higher than the reference value TLref.

A discharge function of the PCU 30 can be used in an SOC adjustment for lowering the SOC. On the other hand, in the case where the vehicle 1 is a vehicle (an electric vehicle, a plug-in hybrid vehicle or the like) that can charge the assembled battery 10 with an electric power supplied from the outside of the vehicle, a charge function of an electric power conversion device (an inverter or the like) that converts the electric power supplied from an external electric power supply (not shown) can be used in an SOC adjustment for raising the SOC.

When the current IB that is input to and output from the assembled battery 10 is excessively large in adjusting the SOC through the use of this charge function or this discharge function, the high-rate deterioration may be accelerated. Accordingly, the progress of the high-rate deterioration can be suppressed by using the protection current IBp as a charge-discharge current for adjusting the SOC. In more concrete terms, the protection current IBp can be used in calculating an input permissible electric power value Win indicating a limit value of the electric power with which the assembled battery 10 is charged, and an output permissible electric power value Wout indicating a limit value of the electric power that is discharged from the assembled battery 10.

Lithium Deposition Suppression Control

It is known that heat may be generated by the assembled battery 10 or the performance thereof may deteriorate through the deposition of lithium metal on the surface of a negative electrode mainly at the time of continuous charge, and the internal resistance may increase mainly at the time of continuous discharge, depending on the mode of use of the assembled battery 10 in the case where a lithium-ion secondary battery as an assembled battery is adopted as the assembled battery 10. In the present embodiment, the ECU 100 performs "lithium deposition suppression control" for suppressing the deposition of lithium metal.

Figure 9:
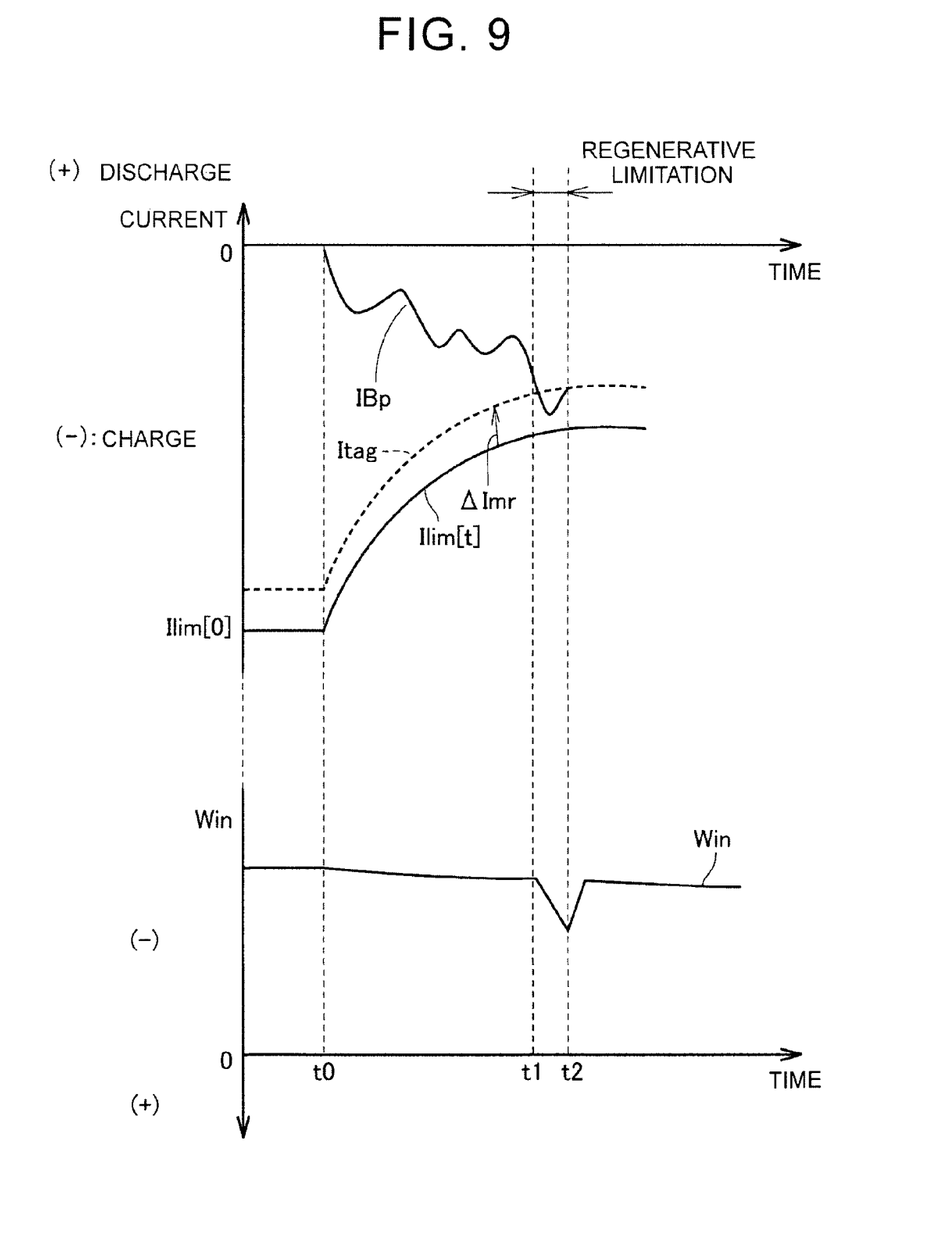
FIG. 9 is a view illustrating lithium deposition suppression control in the present embodiment.

FIG. 9 is a view illustrating lithium deposition suppression control in the present embodiment. In FIG. 9, the axis of abscissa represents elapsed time. The axis of ordinate represents, sequentially from above, the protection current IBp and the input permissible electric power value Win. That is, in lithium deposition suppression control in the present embodiment, the protection current IBp is used instead of the current IB detected by the current sensor 22.

Referring to FIG. 9, when the charge (concretely, regenerative electric power generation) of the assembled battery 10 is started at a time point to, the protection current IBp changes in the negative direction (the charge direction). A permissible input current value Ilim of the assembled battery 10 is set in accordance with a charge-discharge history of the assembled battery 10. For example, as described in WO 2010/005079, the permissible input current value Ilim is obtained as a maximum current value at which lithium metal is not deposited through a fall in the potential of the negative electrode of the assembled battery 10 to a lithium reference potential per unit time. More specifically, Ilim[t] at a time point t can be sequentially calculated by adding/subtracting an amount of decrease through the continuation of charge, an amount of recovery through the continuation of discharge or an amount of recovery through abandonment to/from an initial value Ilim[0] of the permissible input current value in a state where there is no charge-discharge history on each control cycle.

Furthermore, a margin current AImr for the permissible input current value Ilim is set, and an input current limit target value Itag for preventing the deposition of lithium metal is thereby set. The input current limit target value Itag can be set by, for example, offsetting the permissible input current value Ilim in the positive direction. In this case, the offset current value serves as the margin current AImr (see WO 2010/005079 for details).

As shown in FIG. 9, the permissible input current value Ilim and the input current limit target value Itag gradually change in the positive direction (the discharge direction) through the continuous charge of the assembled battery 10. Thus, it is understood that a permissible charge current (|IBp|) decreases. Then, when the protection current IBp becomes smaller than the input current limit target value Itag (IBp<Itag) at a time point t1, the charge current needs to be limited to suppress the deposition of lithium metal.

Therefore, the charge electric power (the regenerative electric power) is limited by changing Win of the assembled battery 10 in the positive direction from the time point t1. For example, Win is changed in the positive direction at a certain rate (at a certain time change rate). Thus, |Win| decreases. This limitation of the charge electric power through the changing of Win will also be referred to as "regenerative limitation".

The charge current decreases (i.e., the protection current IBp changes in the positive direction) through regenerative limitation from the time point t1. At a time point t2, the protection current IBp becomes IBp>Itag again. Thus, regenerative limitation is canceled from the time point t2. Then, Win of the assembled battery 10 gradually returns to a normal value.

As described hitherto, at the time of regenerative braking when a large charge current is generated, regenerative limitation for changing Win, for example, at a certain rate is started as soon as the protection current IBp reaches the input current limit target value Itag to suppress the deposition of lithium metal. The use of the protection current IBp makes the protection current IBp more likely to become smaller than the input current limit target value Itag (makes a condition: IBp<Itag more likely to be fulfilled) than in the case where the current IB is used. Accordingly, regenerative limitation is likely to be imposed, and as a result, the assembled battery 10 can be more effectively protected.

Incidentally, although detailed description will not be repeated, the same limitation as regenerative limitation shown in FIG. 9 is imposed also on the discharge current and the output permissible electric power value Wout. When the protection current IBp becomes large in the positive direction (the discharge direction) and exceeds a threshold corresponding to an output current limit target value, Wout is limited. Incidentally, although not shown in the drawing, the waveform in this case is obtained by vertically inverting the graph of FIG. 7 showing the protection current IBp while using the axis of abscissa (the time axis) as an axis of symmetry. Besides, the axis of ordinate of the graph showing Win may be reread as Wout, and the positive and negative signs of the axis of ordinate may be replaced with each other such that (+) indicates an upward direction and that (−) indicates a downward direction.

The embodiment disclosed herein should be considered to be exemplary and non-restrictive in every respect. The scope of the present disclosure is defined not by the description of the aforementioned embodiment but by the claims. The present disclosure is intended to encompass all the alterations that are equivalent in significance and scope to the claims.

What is claimed is:

1. A secondary battery system comprising:
an assembled battery including a plurality of blocks that are connected in series to one another, each of the plurality of the blocks including cells that are connected in parallel to one another, and each of the plurality of the blocks including a same number of cells;
a current sensor configured to detect a current that is input to the assembled battery and output from the assembled battery; and
a control device configured to perform charge-discharge control of the assembled battery in accordance with a current value of the assembled battery, the control device being configured to calculate a first internal resistance and a second internal resistance, the first internal resistance being an internal resistance of a first block as one of the plurality of the blocks, the second internal resistance being an internal resistance of a second block as another one of the plurality of the blocks, the control device being configured to calculate an internal resistance ratio, the internal resistance ratio being a value obtained by dividing the higher one of the first internal resistance and the second internal resistance by the lower one of the first internal resistance and the second internal resistance, the control device being configured to calculate a protection current and perform the charge-discharge control based on the protection current, and the protection current being a value obtained by multiplying the internal resistance ratio by a current value detected by the current sensor.

2. The secondary battery system according to claim 1, wherein
the first block and the second block are adjacent to each other,
the control device is configured to obtain a maximum value of all the internal resistance ratios, and
the control device is configured to calculate the protection current by multiplying the maximum value of all the internal resistance ratios by a current value detected by the current sensor.

3. The secondary battery system according to claim 1, wherein
the first internal resistance is the highest internal resistance among the internal resistances of the plurality of the blocks,
the second internal resistance is the lowest internal resistance among the internal resistances of the plurality of the blocks, and
the internal resistance ratio is a value obtained by dividing the first internal resistance by the second internal resistance.

4. The secondary battery system according to claim 1, wherein
the charge-discharge control includes protection control of the assembled battery.

5. The secondary battery system according to claim 4, wherein
the protection control is adjusting a state of charge of the assembled battery within a permissible range,
a limit value of an electric power with which the assembled battery is charged and a limit value of an electric power that is discharged from the assembled battery are calculated based on the protection current, when adjusting the state of charge of the assembled battery.

6. The secondary battery system according to claim 4, wherein
the protection control is limiting an input current and an output current of the assembled battery such that the protection current becomes equal to or smaller than a permissible input current value and a permissible output current value.

7. A control method for a secondary battery, the secondary battery including an assembled battery, a current sensor, and a control device, the assembled battery including a plurality of blocks that are connected in series to one another, each of the plurality of the blocks including cells that are connected in parallel to one another, each of the plurality of the blocks including a same number of cells, and the current sensor being configured to detect a current that is input to the assembled battery and output from the assembled battery,
the control method comprising:
calculating a first internal resistance and a second internal resistance by the control device, the first internal resistance being an internal resistance of a first block as one of the plurality of the blocks, and the second internal resistance being an internal resistance of a second block as another one of the plurality of the blocks,
calculating an internal resistance ratio by the control device, the internal resistance ratio being a value obtained by dividing the higher one of the first internal resistance and the second internal resistance by the lower one of the first internal resistance and the second internal resistance,
calculating a protection current by the control device, the protection current being a value obtained by multiplying the internal resistance ratio by a current value detected by the current sensor, and
performing charge-discharge control by the control device, based on the protection current.

* * * * *